US008482088B2

(12) United States Patent
Laming et al.

(10) Patent No.: US 8,482,088 B2
(45) Date of Patent: Jul. 9, 2013

(54) MEMS DEVICE WITH REDUCED STRESS IN THE MEMBRANE AND MANUFACTURING METHOD

(75) Inventors: Richard Ian Laming, Edinburgh (GB); Colin Robert Jenkins, Edinburgh (GB); Anthony Bernard Traynor, Livingston (GB)

(73) Assignee: Wolfson Microelectronics plc, Edinburgh (GB)

( * ) Notice: Subject to any disclaimer, the term of this patent is extended or adjusted under 35 U.S.C. 154(b) by 360 days.

(21) Appl. No.: 12/678,903

(22) PCT Filed: Sep. 18, 2008

(86) PCT No.: PCT/GB2008/003162
§ 371 (c)(1),
(2), (4) Date: May 6, 2010

(87) PCT Pub. No.: WO2009/037456
PCT Pub. Date: Mar. 26, 2009

(65) Prior Publication Data
US 2010/0244162 A1      Sep. 30, 2010

(30) Foreign Application Priority Data

Sep. 19, 2007 (GB) .................................. 0718308.0

(51) Int. Cl.
*H01L 29/84* (2006.01)

(52) U.S. Cl.
USPC ............. 257/416; 257/E21.214; 257/E29.324

(58) Field of Classification Search
USPC .......... 257/415–416, 419, E21.001, E21.526, 257/E29.324
See application file for complete search history.

(56) References Cited

U.S. PATENT DOCUMENTS

| | | | |
|---|---|---|---|
| 2006/0077156 A1* | 4/2006 | Chui et al. | 345/85 |
| 2006/0151207 A1* | 7/2006 | Redman et al. | 174/355 |
| 2006/0233401 A1 | 10/2006 | Wang | |
| 2007/0092983 A1 | 4/2007 | Weigold | |

FOREIGN PATENT DOCUMENTS

| | | |
|---|---|---|
| CA | 2 312 636 A1 | 12/2001 |
| GB | 2 427 321 A | 12/2006 |
| GB | 2 435 544 A | 8/2007 |
| JP | 2002-345089 A | 11/2002 |
| TW | 252211 B1 | 4/2006 |
| WO | WO 01/00523 A1 | 1/2001 |
| WO | WO 2004/036264 A2 | 4/2004 |

OTHER PUBLICATIONS

W. J. Wang et al., "Modeling and Characterization of a Silicon Condenser Microphone," Journal of Micromechanics and Microengineering vol. 14, pp. 403-409, 2004.

* cited by examiner

*Primary Examiner* — Mamadou Diallo
(74) *Attorney, Agent, or Firm* — Dickstein Shapiro LLP (57) ABSTRACT

A MEMS device comprises a membrane layer and a backplate layer formed over the membrane layer. The membrane layer comprises an outer portion and an inner portion raised relative to the outer portion and a sidewall for connecting the inner portion and the outer portion. The sidewall is non-orthogonal to the outer portion.

43 Claims, 5 Drawing Sheets

MEMS DEVICE WITH REDUCED STRESS IN THE MEMBRANE AND MANUFACTURING METHOD

FIELD OF THE INVENTION

This invention relates to a micro-electro-mechanical system (MEMS) device and process, and in particular to a MEMS device and process relating to a transducer, for example a capacitive microphone.

BACKGROUND OF THE INVENTION

Consumer electronics devices are continually getting smaller and, with advances in technology, are gaining ever increasing performance and functionality. This is clearly evident in the technology used in consumer electronic products such as mobile phones, laptop computers, MP3 players and personal digital assistants (PDAs). Requirements of the mobile phone industry for example, are driving the components to become smaller with higher functionality and reduced cost. It is therefore desirable to integrate functions, of electronic circuits together and combine them with transducer devices such as microphones and speakers.

The result of this is the emergence of micro-electrical-mechanical-systems (MEMS) based transducer devices. These may be, for example, capacitive transducers for detecting and/or generating pressure/sound waves or transducers for detecting acceleration. There is a continual drive to reduce the size and cost of these devices through integration with the electronic circuitry necessary to operate and process the information from the MEMS through the removal of the transducer-electronic interfaces. One of the challenges in reaching these goals is the difficulty of achieving compatibility with standard processes used to fabricate complementary-metal-oxide-semiconductor (CMOS) electronic devices during manufacture of MEMS devices. This is required to allow integration of MEMS devices directly with conventional electronics using the same materials and processing machinery.

Microphone devices formed using MEMS fabrication processes typically comprise one or more membranes with electrodes for read-out/drive deposited on the membranes and/or a substrate. In the case of MEMS pressure sensors and microphones, the read out is usually accomplished by measuring the capacitance between the electrodes. In the case of transducers, the device is driven by a potential difference provided across the electrodes.

Figure 1:
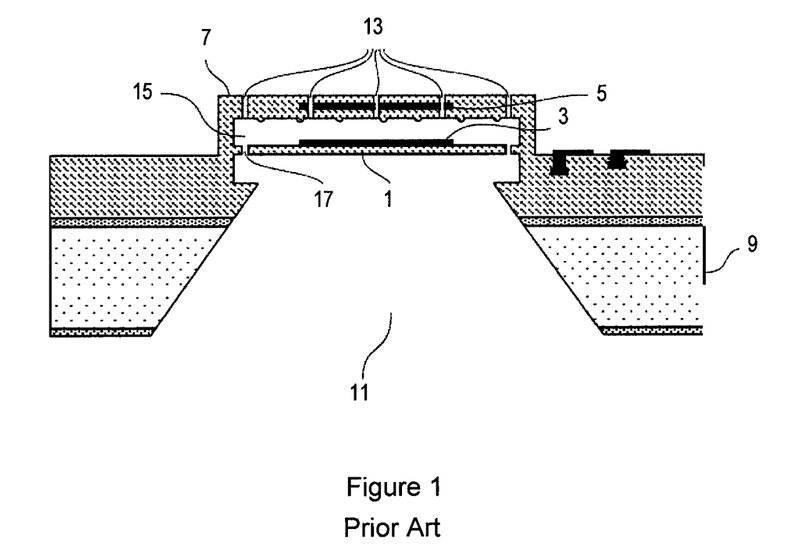
FIG. 1 shows a cross-sectional view of a prior art MEMS microphone.
Figure 2:
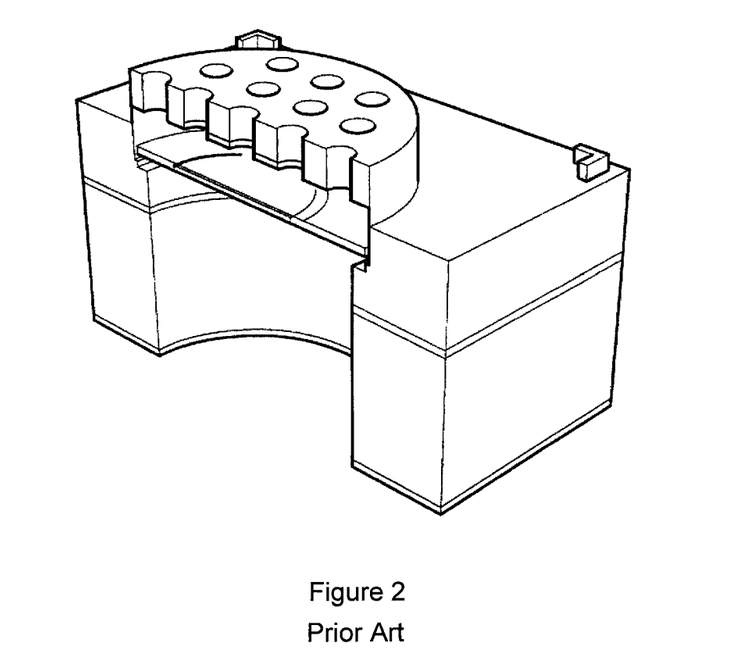
FIG. 2 is a cross-sectional perspective view of the MEMS microphone shown in FIG. 1.

FIGS. 1 and 2 show a schematic diagram and a perspective view, respectively, of a known capacitive microphone device. The capacitive microphone device comprises a flexible membrane 1 that is free to move in response to pressure differences generated by sound waves. A first electrode 3 is mechanically coupled to the flexible membrane 1, and together they form a first capacitive plate of the capacitive microphone device. A second electrode 5 is mechanically coupled to a generally rigid structural layer or back-plate 7, which together form a second capacitive plate of the capacitive microphone device.

The capacitive microphone is formed on a substrate 9, for example a silicon wafer. A back-volume 11 is provided below the membrane 1, and is formed using a "back-etch" through the substrate 9. A plurality of openings 13, referred to hereinafter as acoustic holes, are provided in the back-plate 7 so as to allow free movement of air molecules, such that the sound waves can enter a cavity 15 above the membrane 1. A plurality of openings 17, hereinafter referred to as bleed holes, may be provided for connecting the cavity 15 with the back-volume 11. The cavity 15 and back-volume 11 allow the membrane 1 to move in response to the sound waves entering via the acoustic holes 13 in the back-plate 7.

Thus, in response to a sound wave corresponding to a pressure wave incident on the microphone, the membrane 1 is deformed slightly from its equilibrium position. The distance between the lower electrode 3 and the upper electrode 5 is correspondingly altered, giving rise to a change in capacitance between the two electrodes that is subsequently detected by electronic circuitry (not shown).

FIG. 2 shows a distorted perspective view of the MEMS device illustrated in FIG. 1.

Figure 3:
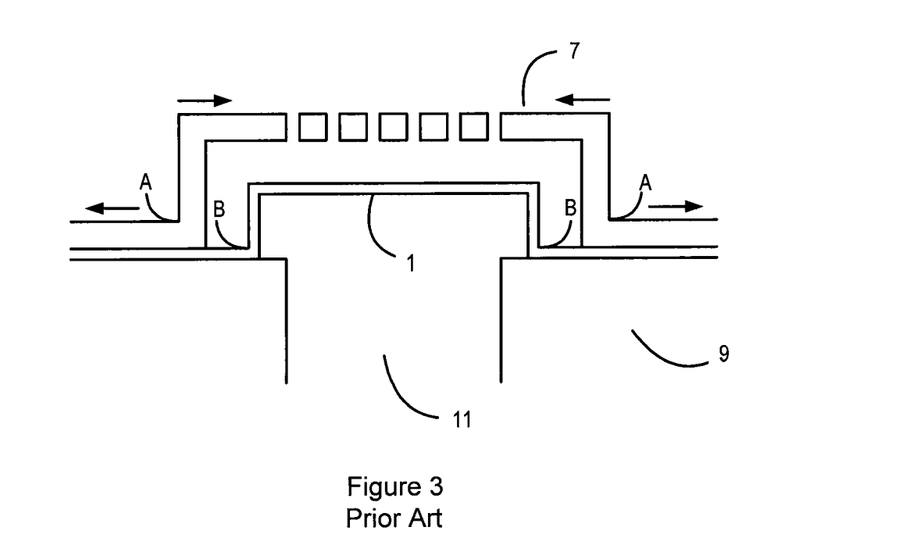
FIG. 3 is a simplified diagram showing a cross-sectional view of a basic MEMS structure.

FIG. 3 shows a simplified cross-sectional view of a conventional MEMS device such as that shown in FIGS. 1 and 2. As mentioned above, a first electrode (not shown) forms part of the flexible membrane 1, and a second electrode (not shown) is attached to or embedded in the rigid back-plate 7 above the membrane 1. Both the back-plate 7 and the membrane 1 may be formed from silicon nitride, for example, and the substrate from silicon. However, the thermal expansion coefficient of silicon is greater than that of silicon nitride and this leads to stresses at the interface between the two dissimilar materials.

The structure of FIG. 3 is formed by various processes of depositing layers and then selectively dry or wet etching portions of the layers away again. This typically involves the use of sacrificial layers or portions which can be removed during subsequent processing steps. These processes take place at relatively low temperatures (in the order of 10-400° C.). When the layers are deposited, there are no significant intrinsic stress concentrations in the structure. When the structure is released by removal of the sacrificial layers the tensile stress of the deposited layer causes a torsional moment in the back-plate sidewall. This leads to a tensile stress concentration on the outer sidewall edge and a compressive stress concentration on the inner sidewall edge. A similar stress can be found in the membrane 1.

These stress concentrations tend to cause cracking that originates at the points labelled A and B in FIG. 3, and can lead to failure of the MEMS device. This stress can also render the MEMS device more susceptible to failure during fabrication. For example, when multiple MEMS devices are fabricated on a single wafer and subsequently separated using a technique known as singulation or dicing, the stress at points A and B can cause the device to crack and fail. After failure at these points, the transducer is rendered useless.

It is therefore an aim of the present invention to provide a MEMS device that does not suffer from the disadvantages mentioned above.

SUMMARY OF THE INVENTION

According to the present invention, there is provided a micro-electrical-mechanical system (MEMS) device comprising: a membrane layer; a back-plate layer formed over the membrane layer; wherein the membrane layer comprises: an outer portion; an inner portion raised relative to the outer portion; and a sidewall for connecting the inner portion and the outer portion; wherein the sidewall is non-orthogonal to the outer portion.

According to another aspect of the present invention, there is provided a method of fabricating a micro-electrical-mechanical system (MEMS) device having a membrane layer, the membrane layer having an inner portion and an outer portion. The method comprises the steps of: depositing a sacrificial layer; shaping the sacrificial layer to leave a portion of sacrificial material to define the inner portion of the membrane layer, wherein the edges of the portion of sacrificial material are sloped; and depositing the membrane layer over the portion of sacrificial material.

According to another aspect of the present invention, there is provided a method of fabricating a micro-electrical-mechanical system (MEMS) device having a back-plate layer, the back-plate layer having an upper portion and a lower portion. The method comprises the steps of: depositing a sacrificial layer; shaping the sacrificial layer to leave a portion of sacrificial material, wherein the edges of the portion of sacrificial material are sloped; and depositing the back-plate layer.

According to another aspect of the present invention, there is provided a micro-electrical-mechanical system (MEMS) device comprising: a membrane layer; a back-plate layer formed over the membrane, the back-plate layer comprising an inner portion and an outer portion, and a sidewall connecting the outer portion and the inner portion; wherein the inner portion of the back-plate layer is spaced apart from the membrane layer, and wherein the membrane layer is connected to at least the sidewall of the back-plate layer.

According to another aspect of the present invention, there is provided a method of fabricating a micro-electrical-mechanical system (MEMS) device. The method comprises the steps of: forming a membrane layer having an inner portion and an outer portion, with a sidewall connecting the inner portion and the outer portion; depositing a sacrificial layer over the inner portion of the membrane layer; and depositing the back-plate layer over the sacrificial layer, and the sidewall and outer portion of the membrane layer.

BRIEF DESCRIPTION OF THE DRAWINGS

For a better understanding of the invention, and to show more clearly how it may be carried into effect, reference will now be made, by way of example only, to the accompanying drawings in which.

DETAILED DESCRIPTION OF THE PREFERRED EMBODIMENT

In the description of the embodiments described below, it is noted that any dimensions (both written and illustrated) are provided as examples only. Furthermore, any references to stress values and targets are intended to refer to the resultant layer/feature stresses for the fully processed MEMS device, and provided as examples only.

Figure 4:
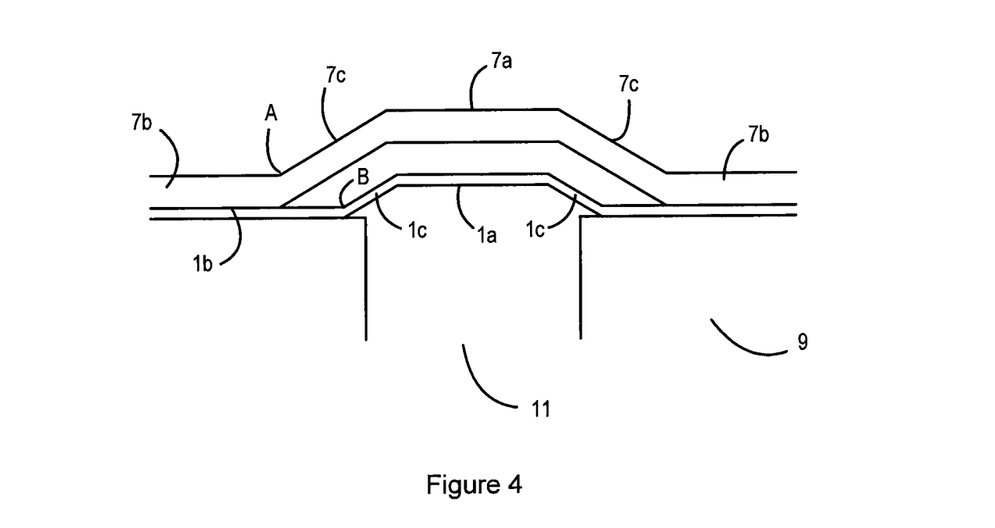
FIG. 4 is a cross-sectional view of a MEMS structure according to a first aspect of the present invention.

FIG. 4 shows a cross-section of a MEMS device according to a first aspect of the invention. As with FIG. 3, the MEMS device comprises a membrane layer 1 supported on a substrate 9, and a back-plate layer 7 positioned over the membrane layer 1. However, unlike the MEMS device of FIG. 3, the back-plate layer 7 and membrane 1 are formed with slanted or angled sidewalls in order to reduce stress concentrations in the MEMS device, as explained in greater detail below.

The back-plate layer comprises a lower portion 7b supported by the membrane layer 1 (the "lower portion" being an outer portion of the back-plate). The back-plate layer also comprises an upper portion 7a for supporting an electrode (not shown), the "upper portion" being an inner portion of the back-plate. The upper portion 7a of the back-plate layer is spaced apart from the membrane layer 1, and connected to the lower portion 7b via a sidewall 7c. However, rather than being orthogonal to the lower portion 7b, the sidewall 7c of the back-plate is non-orthogonal to the lower portion 7b. The sidewall 7c is therefore slanted or angled such that the maximum stress at corner A is reduced compared to the structure of FIG. 3.

The membrane layer 1 is also slanted in a similar manner to the back-plate layer 7. The membrane layer thus comprises an upper (or inner) portion 1a for supporting an electrode (not shown). The upper portion 1a of the membrane layer is supported by a lower (or outer) portion 1b via a sidewall 1c. However, rather than being orthogonal to the lower portion 1b, the sidewall 1c of the membrane is non-orthogonal to the lower portion 1b. The sidewall 1c is therefore slanted or angled such that the maximum stress at corner B is reduced compared to the structure of FIG. 3.

Where the MEMS device has a substantially circular cross-section (such as the device shown in FIG. 2), the inner portions and sidewalls of the membrane layer 1 and back-plate layer 7 each form a hollow frustum. However, it will be appreciated that it is not necessary for the MEMS device to have a circular cross-section.

The membrane 1 of FIG. 4 is formed in a similar manner to the membrane of FIG. 3, using a series of fabrication steps whereby a sacrificial layer is first deposited on the substrate layer 9 in an area that is to form the upper portion 1a of the membrane layer 1, the sacrificial layer then being removed after the membrane layer has been deposited. According to the invention, however, the angled sidewall 1c in the membrane is obtained by first depositing a sacrificial layer, and shaping the sacrificial layer to leave a portion of sacrificial material that defines the inner portion of the membrane layer, wherein the edges of the portion of sacrificial material are sloped. The membrane layer is then deposited conformally over the sacrificial layer, thereby creating the slanted or angled sidewall 1c in the membrane layer 1.

Figure 5A:
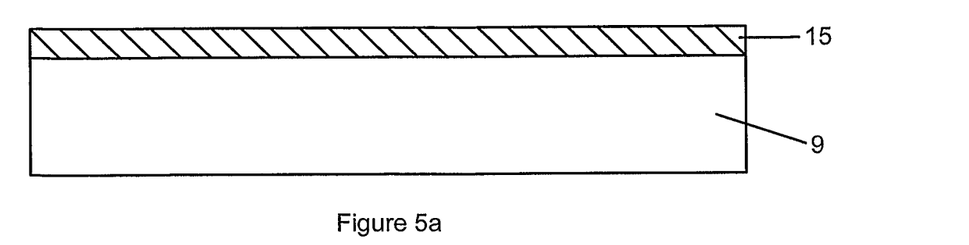
FIGS. 5a to 5d show how the slanted sidewalls in FIG. 4 may be formed according to one aspect of the invention.
Figure 5B:
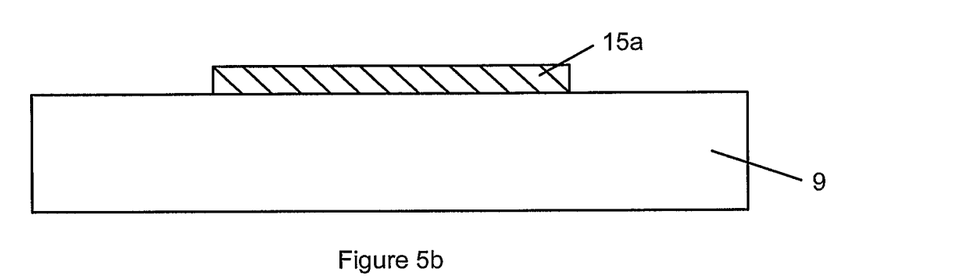
Figure 5C:
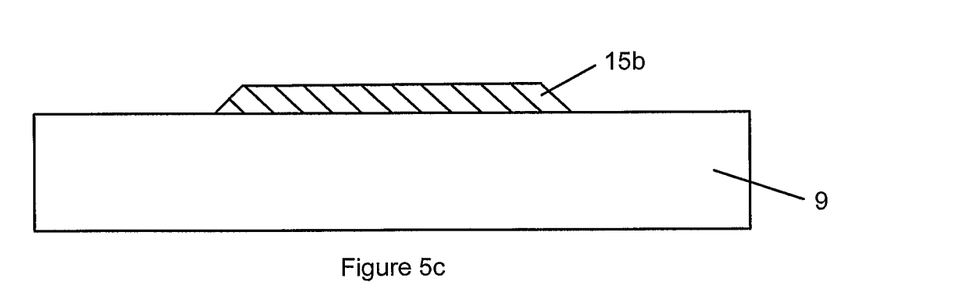
Figure 5D:
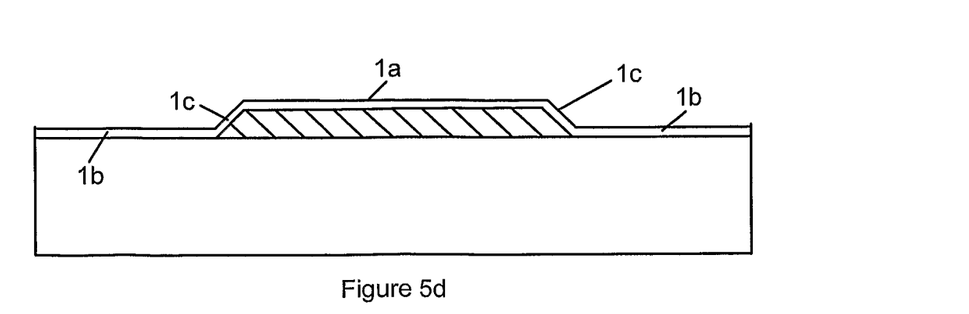

Referring to FIGS. 5a to 5d, according to one aspect of the invention, the sloped edges in the portion of sacrificial material are obtained by first depositing a sacrificial layer 15 over the substrate 9 (as shown in FIG. 5a), and then etching the sacrificial layer 15 to leave an intermediate portion of sacrificial material 15a (as shown in FIG. 5b). The intermediate portion of sacrificial material 15a is then thermally treated, for example cured, to form the portion of sacrificial material 15b comprising sloped edges (as shown in FIG. 5c). The sloped edges are formed as a result of shrinkage in the intermediate portion of sacrificial material 15a, whereby the upper surface of the intermediate portion 15a is able to shrink more freely in a horizontal direction compared to the lower surface of the intermediate portion 15a, the lower surface being constrained due to the fact that it is in contact with the substrate 9. The membrane layer is then deposited conformally over the sacrificial layer, thereby creating the slanted or angled sidewall 1c in the membrane layer 1 (as shown in FIG. 5d).

Alternatively, the sacrificial layer 15, for example a polyimide layer, can be photosensitive i.e. allowing direct patterning by UV exposure. In this case the sacrificial layer 15 is spun on at the required thickness, prebaked at typically 150 degrees C. and exposed. The sacrificial layer is then developed to remove the non-desired polyimide. A final cure at an elevated temperature, for example 350 to 450 degrees C. for 30 minutes, ensures full solvent evaporation and cross-linking for the material, with material shrinkage during this step giving rise to the angled sidewall.

Figure 6A:
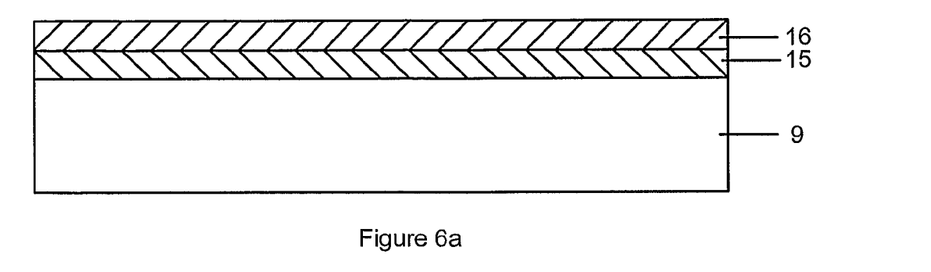
FIGS. 6a to 6d show how the slanted sidewalls in FIG. 4 may be formed according to another aspect of the invention.
Figure 6B:
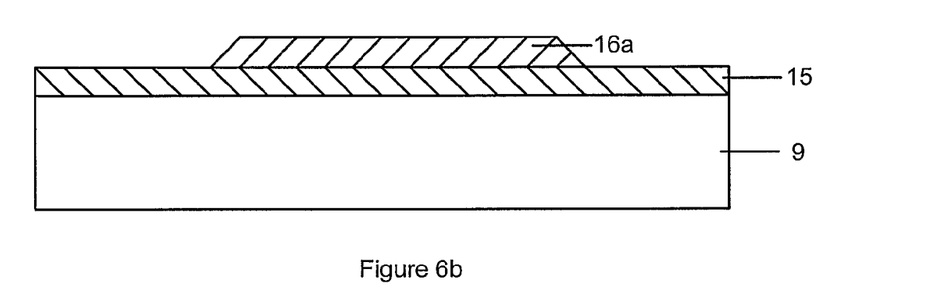

According to another aspect of the invention, the portion of sacrificial material having sloped edges can be formed using the method shown in FIGS. 6a to 6d. First, a resist layer 16, for example a photoresist layer, is deposited over a sacrificial layer 15 (as shown in FIG. 6a). The photoresist layer 16 is then exposed with a pattern, developed and thermally treated, leaving a portion of photoresist material 16a (as shown in FIG. 6b). This results in the portion of photoresist material 16a having sloped edges, caused by shrinkage of the photoresist layer during the formation of the portion 16a. In other words, in a similar manner to that described above, the sloped edges are formed in the portion 16a as a result of shrinkage in the photoresist layer, whereby an upper surface of an intermediate portion of photoresist material is able to shrink in a horizontal direction, whereas a lower surface is constrained from shrinking due to the fact that it is in contact with the sacrificial layer 15.

Figure 6C:
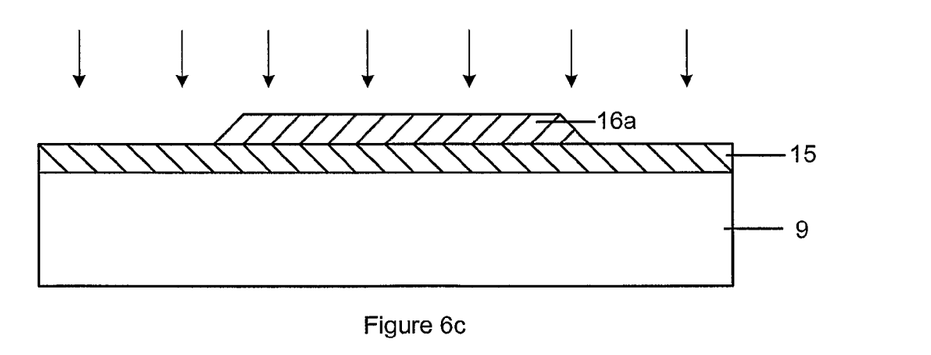
Figure 6D:
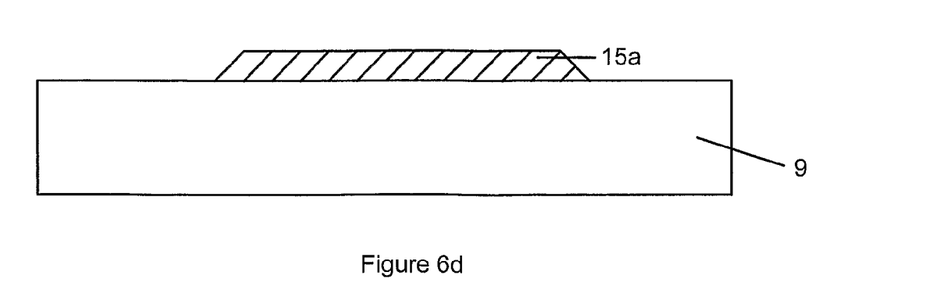

After the portion of photoresist material 16a has been formed, both the sacrificial layer 15 and portion of photoresist material 16a are subjected to an etching process, for example a plasma etch (as shown in FIG. 6c). The sacrificial layer 15 and portion of photoresist material 16a are etched concurrently. Initially, the area of sacrificial material under the portion of photoresist material 16a will not be etched. However, as the etching material penetrates downwards through the outer regions of the sacrificial layer and the portion of photoresist material 16a, the inner area of the sacrificial layer will begin to be etched as the sloped sidewall of the portion of photoresist material 16a is etched away.

This results in the shape of the portion of photoresist material 16a being substantially transferred to the sacrificial layer 15, thus resulting in the portion of sacrificial material 15a having sloped edges.

It is noted that the thicknesses of the photoresist layer 16 and the sacrificial layer 15 can be chosen according to their respective etch rates. For example, if the sacrificial layer 15 and photoresist layer 16 are made from materials that etch away at the same rate, then the two layers can be chosen to have substantially equal thicknesses. However, if the photoresist layer is made from a material that etches away at a greater rate than the material of the sacrificial layer, then the photoresist layer can be made thicker, and vice versa.

According to one example for realising the above method, a polyimide layer is spun on to the substrate to the required thickness. The polyimide layer may comprise a thermally cured polyimide material, which is thermally cured after being deposited with a maximum cure temperature of about 350 degrees C. A photoresist material, for example Shipley SPR 220-7, is spun on to a thickness of about 8 micron. The photoresist material is then exposed with the desired pattern, developed and thermally treated to give a photoresist portion having sloped sidewalls, for example with a 70 degree angle. The resultant shape of the photoresist portion is then etched into the polyimide, for example using a plasma etcher such as an RIE80 and oxygen plasma. As a result the sloped sidewall in the photoresist portion is transferred into the polyimide.

An alternative method of producing the sloped sidewalls of the membrane layer is to use a "greyscale" etching mask. That is, conventionally a sacrificial layer is patterned by placing a mask conforming to the desired pattern over the sacrificial layer. Etchant is then applied to the device and, due to the mask, only the areas open to the etchant are etched away. A greyscale etching mask, however, in addition to "open" areas, where the sacrificial layer is to be completely etched away, and "closed" areas, where no etching is to take place, has "grey" areas comprising apertures of varying size and number. Etchant passes through these apertures and on to the sacrificial layer at a rate that is determined by the number of apertures and/or their size. Thus, a grey area over a sacrificial layer that is to be nearly completely etched away will have a greater number of, and/or larger apertures than a grey area over a sacrificial layer that is to be less aggressively etched.

Thus, with respect to the present invention, the sloped sidewalls may be created by using a greyscale etching mask with a smoothly varying number and/or size of apertures.

The back-plate 7 of FIG. 4 is also formed in a similar manner to the back-plate 7 of FIG. 3, using a series of fabrication steps whereby a sacrificial layer is first deposited on the membrane layer in an area that is to form the upper portion 7a of the back-plate layer, the sacrificial layer then being removed after the back-plate layer 7 has been deposited.

According to the invention, however, the angled sidewall 7c in the back-plate is obtained by first depositing a sacrificial layer, and shaping the sacrificial layer to leave a portion of sacrificial material that defines the inner portion of the back-plate layer, wherein the edges of the portion of sacrificial material are sloped. The back-plate layer is then deposited conformally over the sacrificial layer, thereby creating the slanted or angled sidewall 7c in the back-plate layer 1.

The angled sidewall 7c in the backplate layer can be formed using similar techniques to those described above in relation to the formation of the membrane, for example using the technique shown in FIGS. 5a to 5d, 6a to 6d or the grey-scale mask.

It is noted that, although the lower portion 7b of the back-plate layer 7 is shown as being supported directly by the membrane layer 1, the MEMS device may comprise one or more other layers interposed between the back-plate layer and the membrane layer, for example a dielectric layer or an etch stop layer. In a similar manner, although the lower portion 1b of the membrane layer 1 is shown as being supported directly by the substrate layer 9, the MEMS device may comprise one or more other layers interposed between the membrane layer and the substrate layer, for example a dielectric layer or an etch stop layer.

Finally, the MEMS device may be "released" by removing the sacrificial layers (for example by etching) such that the membrane layer 1 is free to move in relation to the back-plate layer 7. Optionally, this step may involve leaving at least part of the sacrificial layer in-situ in order to strengthen the structure. For example, a portion of sacrificial material underneath the sidewalls of the membrane and/or the back-plate may be left in order to strengthen the sidewalls and reduce the stress.

It is also noted that the invention applies to a MEMS device in which only the membrane or back-plate is fabricated as discussed above.

Figure 7:
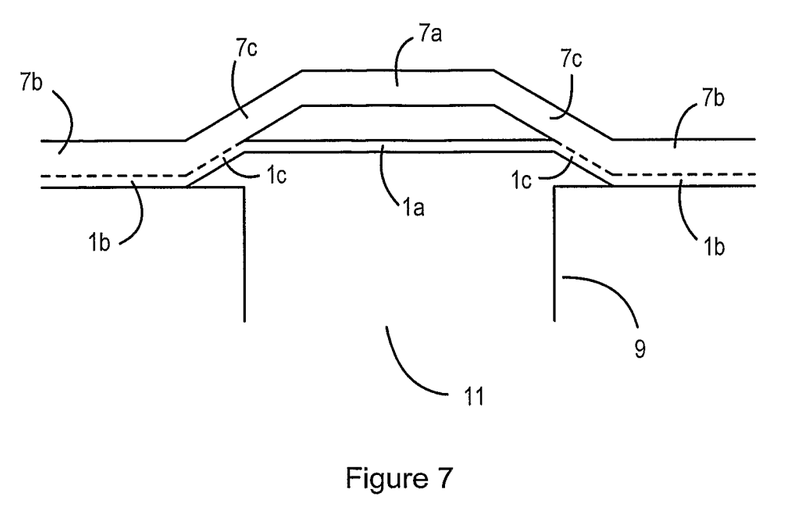
FIG. 7 is a cross-sectional view of a MEMS device according to a second aspect of the present invention.

FIG. 7 shows a MEMS device according to a second aspect of the present invention.

The MEMS device comprises a membrane layer 1 supported on a substrate 9, and a back-plate layer 7 positioned over the membrane layer 1. The back-plate layer 7 may be formed from the same material as the membrane layer 1, such that the back-plate layer 7 and membrane layer 1 fuse together to form a single structure (shown by the dotted lines in FIG. 7). Alternatively, the back-plate layer 7 may be formed from a different material than the membrane layer 1.

The MEMS device of FIG. 7 is formed by depositing and then selectively etching sacrificial layers as described previously with respect to FIG. 4. For example, a first sacrificial layer may be deposited and etched to create a cavity beneath the upper portion of the membrane layer. A second sacrificial layer may then be deposited and etched above the membrane 1 such that the portion of sacrificial layer remaining after the etching process does not overhang the upper portion 1a of the membrane layer 1. Preferably, the sacrificial layer is formed having an angled sidewall, similar to that of the membrane. The angled sidewall may be formed using any one of the techniques described above. Thus, when the back-plate layer is formed over the membrane layer 1 (including the sacrificial material that lies above the upper portion 1a of the membrane), a portion of the sidewall 7c becomes fused with the sidewall 1c of the membrane, thereby resulting in a stronger back-plate structure.

The membrane layer and back-plate layer may be made from silicon nitride, for example, although it will be appreciated that other suitable materials may also be used. The resultant back-plate layer comprises a lower portion 7b supported by the membrane layer 1 (that is, the lower portion 1b of the membrane layer 1 lies beneath the lower portion 7b of the back-plate layer). The back-plate layer also comprises an upper portion 7a for supporting an electrode (not shown). The upper portion 7a of the back-plate layer is spaced apart from the membrane layer 1, and supported by the lower portion 7b via a sidewall 7c. The membrane layer 1 also comprises an upper portion 1a for supporting an electrode (not shown). The upper portion 1a of the membrane layer is supported by the lower portion 1b via a sidewall 1c.

As described above, the sidewall 1c of the membrane layer 1 abuts the sidewall 7c of the back-plate layer 7, such that the two sidewalls 1c, 7c become fused.

It is noted that, although the lower portion 1b of the membrane layer 1 is shown as being supported directly by the substrate layer, the MEMS device may comprise one or more other layers interposed between the membrane layer and the substrate layer, for example a dielectric layer or an etch stop layer.

According to a further aspect of the invention, the thickness of the back-plate can be increased such that the thickness of the back-plate layer is greater than the height of the step from the lower portion 7b to the upper portion 7a in the back-plate layer, thereby providing a lower torsional moment and improved support for both horizontal and vertical loads.

When the thickness of the back-plate layer is greater than the height of the step in the back-plate layer, there exists a horizontal line of sight running through the back-plate. This gives both horizontal and vertical support to the back-plate, and has the added advantage of making the back-plate extremely stiff such that an accurate signal can be obtained.

Figure 8:
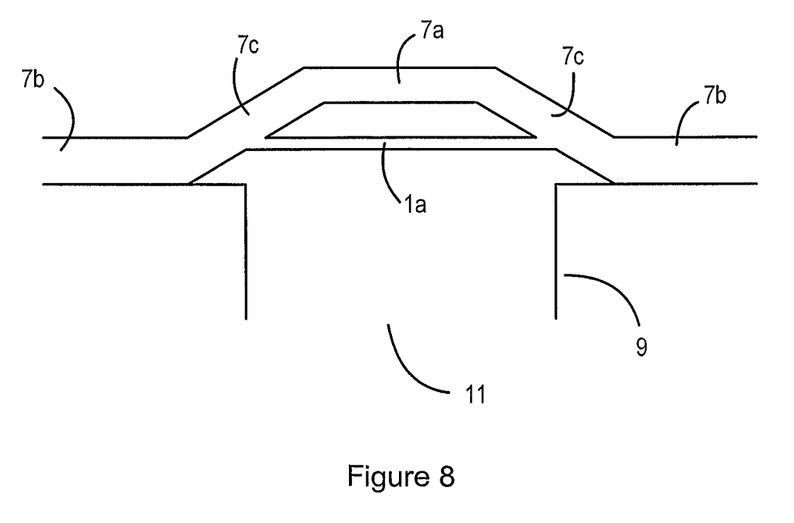
FIG. 8 is a cross-sectional view of a MEMS device according to another embodiment of the present invention.

FIG. 8 shows a MEMS device according to another aspect of the present invention.

The MEMS device shown in FIG. 8 is substantially similar to that shown in FIG. 7. Indeed, FIG. 8 shows the MEMS device after production, such that the membrane layer 1 has fused with the back-plate layer 7. In addition, the sacrificial layer deposited to form the gap between the back-plate layer 7 and the membrane layer 1 is slightly narrower, such that the inner surface of the sidewalls of the back-plate layer 7 are substantially in-line with the inner sidewalls of the membrane layer 1.

In other words, the sacrificial layer used to form the back-plate 7 is slightly smaller in diameter than the top of the membrane 1, and results in the back-plate 7 being wrapped around the membrane. It will be appreciated that, although not shown in FIG. 8, a corresponding step may exist in the outer sidewall 7c of the back-plate.

A person skilled in the art will appreciate that the above description of the preferred embodiments may be applied to any MEMS device, for example a MEMS microphone or a pressure transducer. The invention is also applicable to other MEMS transducers, such as accelerometers having a mass located on the membrane.

Thus, although the embodiments have been described in relation to the membrane moving in response to pressure differences, and in particular pressure differences caused by sound waves, the membrane may also be configured to move in response to absolute pressure.

In addition, it will be appreciated that the MEMS device may include one or more additional layers to those shown in the described embodiments.

Throughout the description above, reference has been made to "upper" and "lower" portions of the membrane and the back-plate, relative to the substrate on which the layers are formed. It will be apparent to the reader that these correspond, respectively, to the inner and outer portions of the membrane and the back-plate, relative to the central axis of the device.

Furthermore, it is noted that the present invention embraces an electronic package comprising a MEMS transducer as described above. In addition, the electronic package may comprise a substrate having a recess as defined in co-pending application number GB0716187.0 filed on 17 Aug. 2007, wherein the MEMS transducer is situated in said recess. The package may also comprise a lid, wherein the package forms an RF cage.

It is noted that the invention may be used in a number of applications. These include, but are not limited to, consumer applications, medical applications, industrial applications and automotive applications. For example, typical consumer applications include laptops, mobile phones, PDAs and personal computers. Typical medical applications include hearing aids. Other applications include active noise cancellation. Typical automotive applications include hands-free sets, acoustic crash sensors and active noise cancellation.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A micro-electrical-mechanical system (MEMS) device comprising:
    a membrane layer comprising an inner portion, an outer portion, and a sidewall connecting the outer portion and the inner portion;
        a back-plate layer formed over the membrane, the back-plate layer comprising an inner portion and an outer portion, and a sidewall connecting the outer portion and the inner portion;
        wherein the inner portion of the back-plate layer is spaced apart from the membrane layer, and wherein the membrane layer is connected to at least the sidewall of the back-plate layer.

2. The micro-electrical-mechanical system (MEMS) device of claim 1, wherein the inner portion of the membrane layer is raised relative to the outer portion of the membrane layer and wherein the sidewall of the membrane layer is non-orthogonal to the outer portion of the membrane layer.

3. A MEMS device as claimed in claim 2, wherein the inner portion of the membrane layer lies in a plane that is parallel to the plane of the outer portion of the membrane layer.

4. A MEMS device as claimed in claim 2, wherein the inner portion of the back-plate layer is spaced apart from the outer portion of the back-plate layer and wherein the sidewall of the pack-plate layer is non-orthogonal to the outer portion of the back-plate layer.

5. A method of fabricating the micro-electrical-mechanical system (MEMS) device of claim 2 having a membrane layer, the membrane layer having an inner portion and an outer portion, the method comprising the steps of:
depositing a sacrificial layer;
shaping the sacrificial layer to leave a portion of sacrificial material to define the inner portion of the membrane layer, wherein the edges of the portion of sacrificial material are sloped; and
depositing the membrane layer over the portion of sacrificial material.

6. A method as claimed in claim 5, wherein the shaping step comprises:
placing an etching mask over the sacrificial layer, said etching mask comprising at least one greyscale portion defining the edges of the portion of sacrificial material; and
applying etchant to the sacrificial layer through the etching mask.

7. A method as claimed in claim 5, wherein the shaping step comprises:
etching the sacrificial layer to leave an intermediate portion of sacrificial material; and
curing the intermediate portion of sacrificial material to form said portion of sacrificial material comprising sloped edges.

8. A method as claimed in claim 5, wherein the shaping step comprises:
depositing a resist layer over the sacrificial layer:
shaping the resist layer to leave a portion of resist material to define the portion of sacrificial material, wherein the edges of the portion of resist material are sloped; and
applying etchant to the sacrificial layer and the portion of resist material, to leave the portion of sacrificial material that defines the inner portion of the membrane layer.

9. A method as claimed in claim 8, wherein the step of shaping the resist layer comprises:
patterning the resist layer to leave an intermediate portion of resist material; and
thermally treating the intermediate portion of resist material to form said portion of resist material comprising sloped edges.

10. A method as claimed in claim 8, wherein the step of applying etchant comprises the step of etching away the sacrificial layer and the portion of resist material concurrently, such that the shape of the portion of resist material is substantially transferred to the shape of the portion of sacrificial material.

11. A method as claimed in claim 8, wherein the resist material comprises a photoresist material.

12. A method as claimed claim 5, further comprising:
after depositing the membrane layer, removing at least part of the portion of sacrificial material.

13. A method as claimed in claim 12, wherein at least part of the portion of sacrificial material is left underneath the sidewalls of the membrane layer.

14. A method as claimed in claim 12, comprising:
after depositing the membrane layer, removing the entire portion of sacrificial material.

15. A method of fabricating the micro-electrical-mechanical system (MEMS) device of claim 1, the method comprising the steps of:
depositing a sacrificial layer;
shaping the sacrificial layer to leave a portion of sacrificial material, wherein the edges of the portion of sacrificial material are sloped; and
depositing the back-plate layer.

16. A method as claimed in claim 15, wherein the shaping step comprises:
placing an etching mask over the sacrificial layer, said etching mask comprising at least one greyscale portion defining the edges of the portion of sacrificial material; and
applying etchant to the sacrificial layer through the etching mask.

17. A method as claimed in claim 15, wherein the shaping step comprises:
etching the sacrificial layer to leave an intermediate portion of sacrificial material; and
curing the intermediate portion of sacrificial material to form said portion of sacrificial material comprising sloped edges.

18. A method as claimed in claim 15, wherein the shaping step comprises:
depositing a resist layer over the sacrificial layer:
shaping the resist layer to leave a portion of resist material to define the portion of sacrificial material, wherein the edges of the portion of resist material are sloped; and
applying etchant to the sacrificial layer and the portion of resist material, to leave the portion of sacrificial material that defines the inner portion of the back-plate layer.

19. A method as claimed in claim 18, wherein the step of shaping the resist layer comprises:
patterning the resist layer to leave an intermediate portion of resist material; and
thermally treating the intermediate portion of resist material to form said portion of resist material comprising sloped edges.

20. A method as claimed in claim 18, wherein the step of applying etchant comprises the step of etching away the sacrificial layer and the portion of resist material concurrently, such that the shape of the portion of resist material is substantially transferred to the shape of the portion of sacrificial material.

21. A method as claimed in claim 18, wherein the resist material comprises a photoresist material.

22. A method as claimed in claim 15, further comprising:
after depositing the back-plate layer, removing at least part of the portion of sacrificial material.

23. A method as claimed in claim 22, wherein at least part of the portion of sacrificial material is left underneath the sidewalls of the back-plate layer.

24. A method as claimed in claim 22, comprising:
after depositing the back-plate layer, removing the entire portion of sacrificial material.

25. A method of fabricating the micro-electrical-mechanical system (MEMS) device of claim 1, the method comprising the steps of:
forming the membrane layer having an inner portion and an outer portion, with the sidewall connecting the inner portion and the outer portion;
depositing a sacrificial layer over the inner portion of the membrane layer; and depositing the back-plate layer over the sacrificial layer, and the sidewall and outer portion of the membrane layer.

26. A communications device comprising a micro-electrical-mechanical system (MEMS) device as claimed in claim 2.

27. A portable telephone device comprising a micro-electrical-mechanical system (MEMS) transducer as claimed in claim 2.

28. A portable telephone device as claimed in claim 27, wherein the MEMS transducer is used in a noise-cancellation process.

29. An audio device comprising a micro-electrical-mechanical system (MEMS) transducer as claimed in claim 2.

30. An audio device as claimed in claim 29, wherein the MEMS transducer is used in a noise-cancellation process.

31. A computer device comprising a micro-electrical-mechanical system (MEMS) transducer as claimed in claim 2.

32. A vehicle comprising a micro-electrical-mechanical system (MEMS) transducer as claimed in claim 2.

33. A medical device comprising a micro-electrical-mechanical system (MEMS) transducer as claimed in claim 2.

34. An industrial device comprising a micro-electrical-mechanical system (MEMS) transducer as claimed in claim 2.

35. A package comprising a MEMS transducer as claimed in claim 2.

36. A package as claimed in claim 35, wherein the electronic package comprises a substrate having a recess, and wherein the MEMS transducer is situated in said recess.

37. A package as claimed in claim 35, wherein the package comprises a lid.

38. A package as claimed in claim 35, wherein the package forms an RF cage.

39. A MEMS device as claimed in claim 1, wherein the membrane layer and the back-plate layer are formed from different materials.

40. A MEMS device as claimed in claim 1, wherein the membrane layer and the back-plate layer are formed from the same material.

41. A MEMS device as claimed in claim 1, wherein the sidewall of the membrane layer supports at least part of the sidewall of the back-plate layer.

42. A MEMS device as claimed in claim 1, wherein the thickness of the back-plate layer is greater than the step height of the back-plate layer at the inner portion.

43. A method as claimed in claim 25, wherein the step of depositing the sacrificial layer comprises the step of etching the sacrificial layer prior to curing the sacrificial layer, such that the sacrificial layer comprises angled sidewalls.

* * * * *

UNITED STATES PATENT AND TRADEMARK OFFICE
CERTIFICATE OF CORRECTION

PATENT NO. : 8,482,088 B2  Page 1 of 1
APPLICATION NO. : 12/678903
DATED : July 9, 2013
INVENTOR(S) : Laming et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 410 days.

Signed and Sealed this
Eighth Day of September, 2015

Michelle K. Lee
*Director of the United States Patent and Trademark Office*